United States Patent [19]
Jurek

[11] 4,399,511
[45] Aug. 16, 1983

[54] POWER FACTOR MONITORING AND CONTROL SYSTEM FOR RESISTANCE WELDING

[75] Inventor: Dennis J. Jurek, Grafton, Wis.

[73] Assignee: Square D Company, Palatine, Ill.

[21] Appl. No.: 223,520

[22] Filed: Jan. 8, 1981

Related U.S. Application Data

[63] Continuation-in-part of Ser. No. 6,990, Jan. 29, 1979, Pat. No. 4,254,466.

[51] Int. Cl.³ .......................... G06F 15/46; B23K 9/10
[52] U.S. Cl. .................................... 364/477; 219/110; 364/482; 364/483
[58] Field of Search ............... 364/477, 482, 483, 511, 364/552; 219/108, 109, 110, 114, 117.1

[56] References Cited

U.S. PATENT DOCUMENTS

| | | | |
|---|---|---|---|
| 3,654,424 | 4/1972 | Vanderhelst | 219/110 |
| 3,694,615 | 9/1972 | Brandeis | 219/110 X |
| 3,832,518 | 8/1974 | O'Neal, Jr. | 219/110 |
| 4,076,974 | 2/1978 | Gee | 219/114 X |
| 4,104,724 | 8/1978 | Dix et al. | 219/108 X |
| 4,230,929 | 10/1980 | Blair et al. | 219/114 X |

Primary Examiner—Joseph F. Ruggiero
Attorney, Agent, or Firm—Michael J. Femal; Richard T. Guttman

[57] ABSTRACT

A power factor monitoring and control system for controlling the quality of a spot weld made by assembly line welders. The control system of the present invention detects a change in the load power factor as the weld is formed which is manifested as a change in the current extinction angle of the half cycles of weld current. The time interval between the instant weld current is extinguished at the end of a programmed half cycle and an instant when current is extinguished at the end of a subsequent half cycle provides a measure of the resistance across the weld nugget. The time interval information is stored and compared with information provided during a previous half cycle to generate a difference signal. The change in resistance in the secondary circuit is reflected through the transformer to the transformer primary circuit as a decrease in power factor. The timing changes resulting from the decrease in power factor are sensed by the control circuitry to generate signals which operate to selectively vary the weld heat setting of the welder control or terminate the weld current.

7 Claims, 7 Drawing Figures

POWER FACTOR MONITORING AND CONTROL SYSTEM FOR RESISTANCE WELDING

BACKGROUND OF THE INVENTION

This application is a continuation-in-part of U.S. patent application having Ser. No. 006,990, filed Jan. 29, 1979 U.S. Pat. No. 4,254,466 entitled "Power Factor Monitoring and Control System for Resistance Welding".

This invention relates to a monitoring and control system for a resistance welding apparatus and, more particularly, to a control which senses a resistive change that occurs in the formation of a quality weld between the electrodes by monitoring a corresponding change in an interval of current present in a winding of a welding transformer to provide an automatic heat control for improving weld quality over the tip life as well as reducing power consumption or to terminate the weld current when a resistive change causes a preprogrammed change in the instant when a half cycle of weld current is extinguished. When resistance welding is used to weld two metal parts together, a number of parameters in the welding process must be monitored in order to provide a quality weld. One parameter which much be carefully monitored is the wear of the welding electrodes (tips) which must be compensated by increasing the weld heat to insure good quality welds throughout the tip life.

Prior art attempts which were used to assure weld quality despite tip wear (mushrooming) included the following monitoring (feedback) control techniques:

1. Optical (infrared), i.e., monitoring surface radiation to assess weld quality;
2. Weld expansion, i.e., monitoring electrode displacement (thermo-expansion);
3. Ultra-sonic, i.e., monitoring ultra-sonic transmissions transmitted through the weld area during the weld formation process;
4. Weld energy, i.e., monitoring weld energy during the formation of the weld;
5. Acoustic emissions (expulsion detector), i.e., monitoring the acoustic emissions occurring during weld formation; and,
6. Resistance change, i.e., monitoring the resistance change occurring during the weld formation.

Typically, the above prior art techniques of monitoring weld quality were implemented by attaching or positioning various fragile sensors and their respective leads in direct contact with the welding electrodes or in close proximity thereto. Unfortunately, these monitoring devices and their leads attached to or in close proximity to the welding electrodes were subject to breakage in industrial environments in which the welding apparatus is required to operate.

For the above-stated reasons, monitoring devices and their attendant leads attached to or in close proximity to the welding electrodes were met with disfavor and were rejected as a means of control because of continual maintenance problems. Examples of the above type of monitoring techniques and associated devices are contained in a publication entitled "Resistance Welding Control and Monitoring" published by the Welding Institute located at Abington Hall, Abington, Cambridge, CB 16A1, United Kingdom, copyrighted 1977.

One successful way to compensate for electrode wear without attaching monitoring devices next to or on the welding tips is found in the digital welder control system of U.S. Pat. No. 4,104,724 ('724 patent). The controller as described in this patent provides a maintenance interval counter and compensator control having a four-step stepper. The stepper control of this patent is used to automatically increase the weld heat after a preset number of welds are made by the electrodes based on past experience to compensate for electrode mushrooming. Moreover, the digital welder control system of the '724 patent is hereby incorporated by reference as a type of digital welder control that is particularly suited to be modified to incorporate the features of the present invention.

SUMMARY OF THE INVENTION

In one embodiment of a circuit incorporating the features according to the present invention, an automatic power factor circuit (hereinafter called APF) senses the current through the silicon controlled recitifier (hereinafter called SCR) welding contactors which control the current to the primary winding of the welding transformer. When the APF circuit senses the end of current conduction or extinction of weld current of each half cycle, it generates a signal. Since the quality of a spot weld can be correlated to a resistive drop from a maximum resistance measured through the weld as the weld progresses during the fusion process, a quality weld can be assured if a proper resistive drop has occurred while the weld is formed. It has been found that resistive drop in the secondary winding circuit of the welding transformer is reflected back to the primary winding of the welding transformer as a change in the total load power factor, as evidenced by a change in the instant of current extinction occurring at the end of each weld half cycle.

A polarity detector circuit connected across the line voltage detects the polarity of the line voltage and, when the line voltage polarity reverse, a zero crossing signal is produced to initiate the timing of a timed interval. The zero voltage crossing signal from the detector together with the current signal from the APF circuit are used to define the beginning and end of a time interval which correlates to the change in resistance that occurs during the formation of a weld. The two signals are inputted to a microprocessor, which performs a timing function to recreate a dynamic resistance curve. When a preprogrammed resistive drop has occurred, the microprocessor either increases the weld heat setting or terminates the weld. In the present invention, the heat of the weld is increased as the tips deteriorate and mushroom by varying the time in the representative heat equation of $H=I^2rt$ as is well known in the art. Thus, the number of half cycles of current per weld are increased as the tips deteriorate and mushroom. Although the four-step stepper control of the '724 patent is not required in conjunction with the present invention, it is possible if a weld period extends beyond the zero to 59 cycle timing period that the four-step stepper control can be used to increase the weld heat to reduce the number of weld cycles required to bring the weld back within the zero to 59 cycle timing period which is common to all sequences in the digital welder control system of the '724 patent.

In another embodiment, the time interval between the instant when weld current is initiated and extinguished at the end of a preprogrammed half cycle of weld current and the interval between instants when weld current is initiated and extinguished at the end of each half cycle subsequent to the preprogrammed half cycle provides a signal. The time interval signal is indicative of a weld quality and, when the time interval signal is at least equal to a preprogrammed value, the heat control setting of the welding control may be adjusted, as previously described, or the weld current and weld time may be terminated.

Accordingly, an object of the present invention is to provide a power factor monitoring and control system for a resistance welding apparatus in which the quality of a weld is determined by measuring a decrease in resistance associated with a quality weld in the secondary circuit of the welding transformer by sensing a change in the power factor of the current and voltage in the primary circuit of the welding transformer thereby eliminating the necessity of attaching monitoring devices and their respective leads in close proximity to the welding electrodes.

Another object is to provide a power factor monitoring and control system for a resistance welder circuit in which deterioration of the welding electrodes is automatically compensated by increasing the number of weld half cycles until a resistive drop associated with a quality weld occurs.

A further object is to provide a power factor monitoring and control system for a resistance welding apparatus which reduces the complexity of the devices and associated circuitry required to monitor a weld as it is formed to provide a quality weld and which eliminates the necessity of connecting external monitoring circuitry to the electrodes or the secondary circuit of the welding transformer.

Still another object is to provide a power factor monitoring and control system for a resistance welding apparatus in which a simulation of the actual dynamic, resistive curve generated during the resistance welding of metal parts is reproduced by the control for determining when the resistive changes associated with a quality weld has occurred for terminating the weld.

It is an object of the present invention to provide a control circuit for a resistance welding apparatus which monitors the welding current and change in resistance in metal parts as the parts are welded together. The circuit detects the instants when half cycles of alternating polarity welding current are extinguished in one of a pair of windings of a welder transformer and causes the control to execute a control function when the time interval between the instants when current is initiated and extinguished during a preprogrammed half cycle and a subsequent half cycle is at least equal to a preprogrammed value.

Another object is to provide a control circuit for a resistance welding apparatus which monitors the welding current and change in resistance in metal parts as the parts are welded together. The circuit detects the instants when half cycles of alternating polarity welding current are extinguished in a primary winding of a welder transformer and causes the control to execute a control function when a difference in the time intervals between the instant current is initiated and extinguished during a preprogrammed half cycle and a subsequent half cycle is at least equal to a preprogrammed value.

It is an object of the present invention to provide a control circuit for a resistance welding apparatus which monitors the welding current and change in resistance in metal parts as the parts are welded together. The circuit detects the instants when half cycles of alternating polarity welding current are extinguished in one of a pair of windings of a welder transformer and causes the control to execute a control function when the time interval between a reference instant and the instant current is extinguished during a half cycle subsequent to a preprogrammed half cycle providing the reference instant is at least equal to a preprogrammed value.

It is an object of the present invention to provide a control circuit for a resistance welding apparatus which monitors the welding current and change in resistance in metal parts as the parts are welded together. The circuit detects the instants when half cycles of alternating polarity welding current are initiated and extinguished in one of a pair of windings of a welder transformer and causes the control to terminate the weld current when the time interval between the instants when current is initiated and extinguished during a preprogrammed half cycle and a subsequent half cycle is at least equal the preprogrammed value.

Patent application Ser. No. 012,926, filed Feb. 16, 1979, U.S. Pat. No. 4,289,951 entitled "Power Factor Monitoring and Control System for Resistance Welding with Line Disturbance Immunity" is hereby incorporated by reference as an example of measuring the instants when weld current is initiated and extinguished in a preprogrammed half cycle and subsequent half cycles for providing a signal representative of the time differences therebetween to terminate a weld when the signal is equal to a preprogrammed value.

Other objects and advantages will become apparent from the description wherein reference is made to accompanying drawings illustrating the preferred embodiments of the invention. It should be understood, of course, that the foregoing disclosure relates to only a preferred embodiment (or embodiments) of the invention and that numerous modifications or alternations may be made therein without departing from the spirit and the scope of the invention as set forth in the appended claims.

DESCRIPTION OF THE PREFERRED EMBODIMENT

Figure 1:
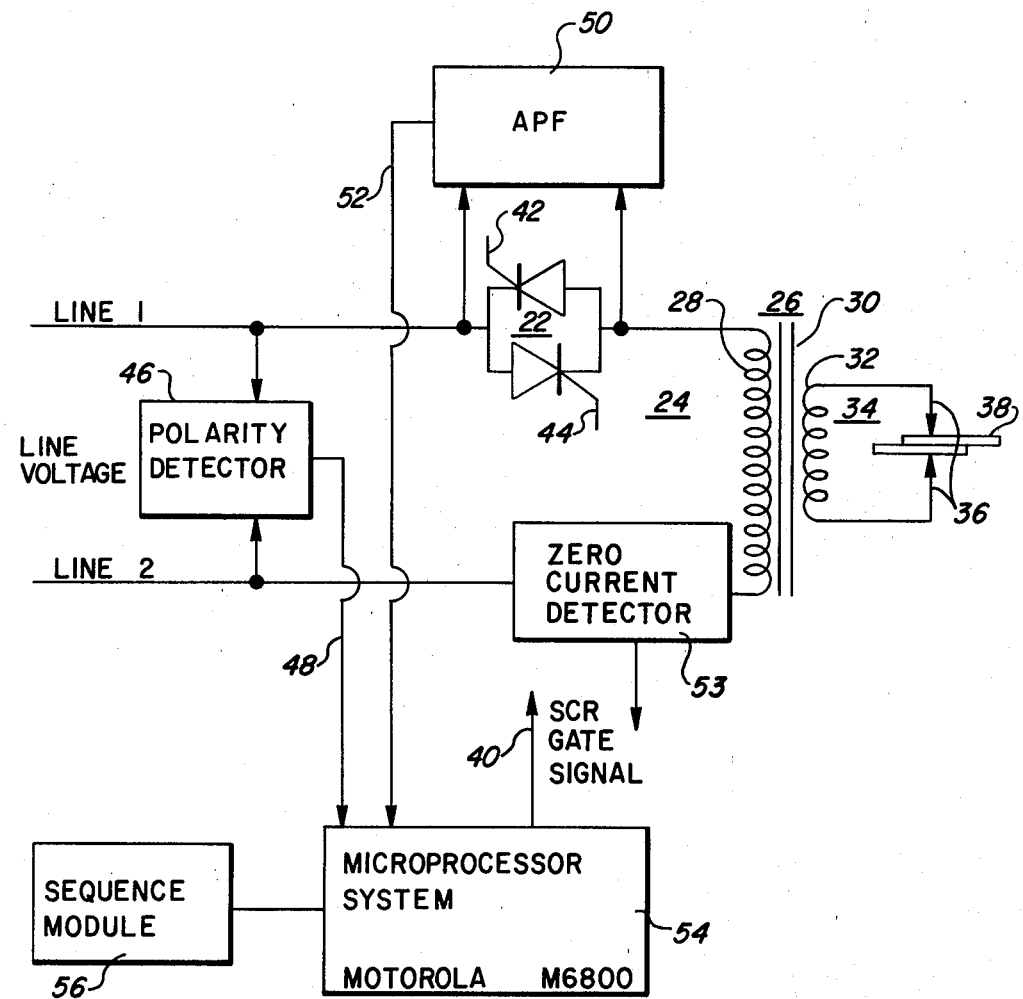
FIG. 1 shows a partial block and schematic representation of a power factor and monitoring control system for a resistance welding control system embodying the principles of the present invention.

Referring to FIG. 1, a pair of inversely connected SCR welding contactors 22 are used to control the current delivered to a primary circuit 24 of a welding transformer 26 including a primary winding 28, an iron core 30, a secondary winding 32, and a secondary circuit 34. The secondary circuit 34 further includes a pair of welding electrodes 36 with workpieces 38 clamped therebetween for a typical spot weld of the type used in the automotive industry.

The primary winding 28 of the welding transformer 26 is connected across lines 1 and 2, respectively, which, in turn, are connected to a line voltage source of any known value for resistance welding. The control system could be connected to either single phase voltage source, as shown, or a polyphase voltage source utilizing any known converter in the art. Initiation of current conduction through the SCR welding contactors 22 is controlled by an SCR gate signal 40 which is fed to gates 42 and 44 of the SCR welding contactors 22. The line voltage polarity is determined by a polarity detector circuit 46, which, for the purpose of this embodiment, can be considered to produce an output signal of a logic one on a line 48 when the voltage on line 1 is positive with respect to line 2. Similarly, an output signal of a logic zero is produced on line 48 when line 1 is negative with respect to line 2. Thus, detector 46 senses the transition of the line voltage from a positive to a negative half cycle and negative to positive half cycle as it crosses the zero voltage line. The state of conduction of the SCR welding contactors 22 is determined by an automatic power factor (APF) circuit 50 as described in the '724 patent or in the alternative by a series zero current detector 53 which is well known in the art. The APF circuit 50 senses the voltage across the SCR welding contactors 22 and produces a logic zero output on a line 52 when voltage is present across the SCR welding contactors 22 (this corresponds to the non-conduction state of contactors 22). If a nominal voltage is present across the SCR welding contactors 22, the welding contactors 22 are conducting and the APF circuit 50 generates a logic one output on line 52. Both the output signals on lines 48 and 52 are fed to a microprocessor system 54 which preferably is an 8-bit microprocessor of any known type, such as Motorola M6800, as its main control element. The transition of the line voltage from a positive to a negative value produces a polarity output signal corresponding to the zero crossing of the line voltage on line 48. The polarity output signal in conjunction with the conduction signal produced by the APF circuit 50 on line 52 may be used to define a time period related to the change of resistance that occurs during the formation of a weld.

The microprocessor system 54 consisting of the 8-bit Motorola M6800 microprocessor and its associated memory and various ancillary devices receives the line voltage polarity information as an input on line 48, as well as input information relating to the state of conduction of the SCR welding contactors 22 on line 52. The microprocessor system 54 in response to this input information generates appropriately timed SR welding contactor gate signals on line 40 which are gate signals to gates 42 and 44 of the SCR welding contactors 22 based on operator input data stored in a sequence module 56, such as the desired welding current, the duration of the weld, etc., as fully described in the '724 patent and based on an analysis by the microprocessor of the relative timing between the line voltage polarity transition represented by the output on line 48 and the cessation of the conduction of the SCR welding contactors 22 represented by an output signal on line 52.

Figure 2:
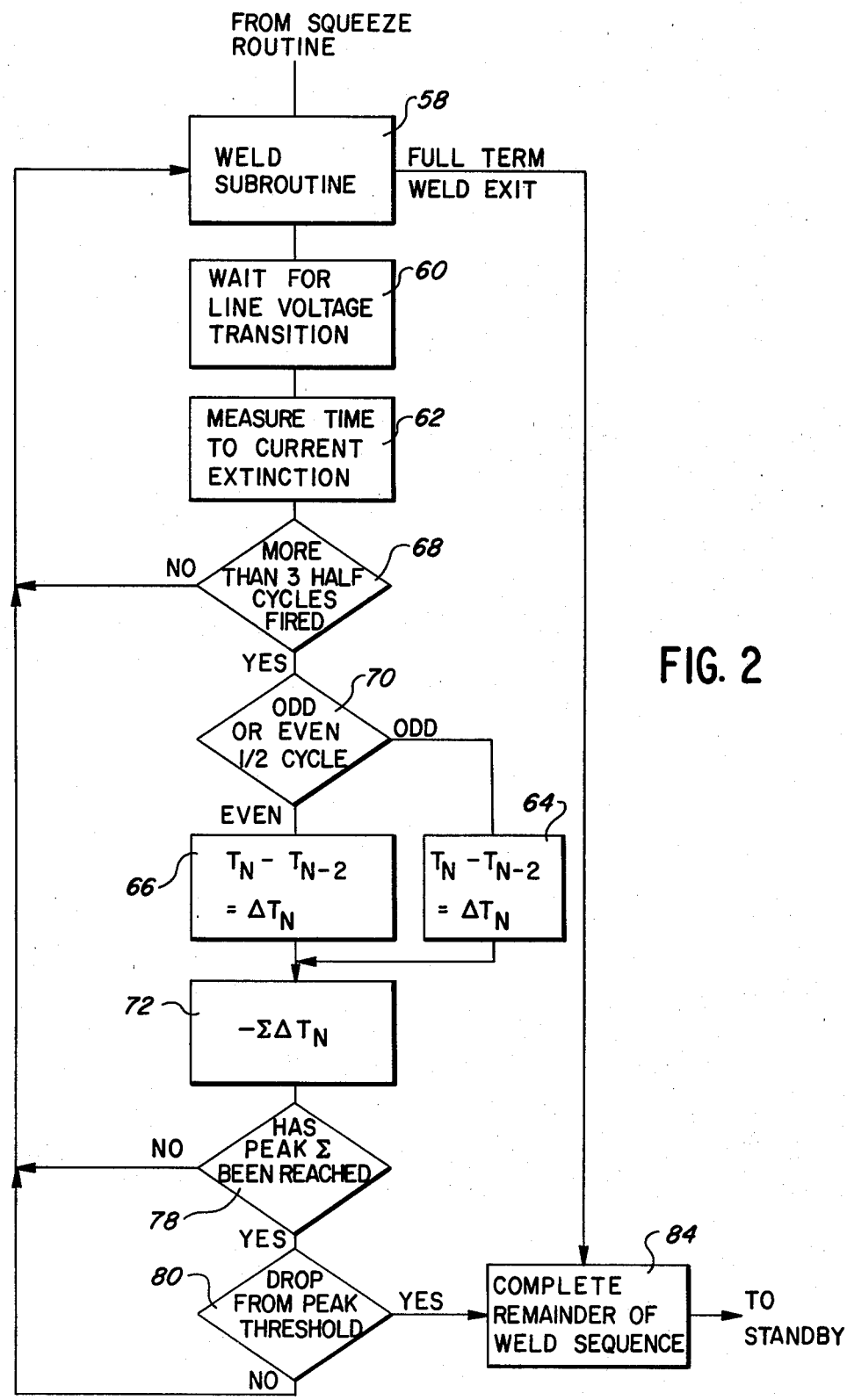
FIG. 2 is a block diagram of a flowchart utilized by the control system of FIG. 1.
Figure 2A:
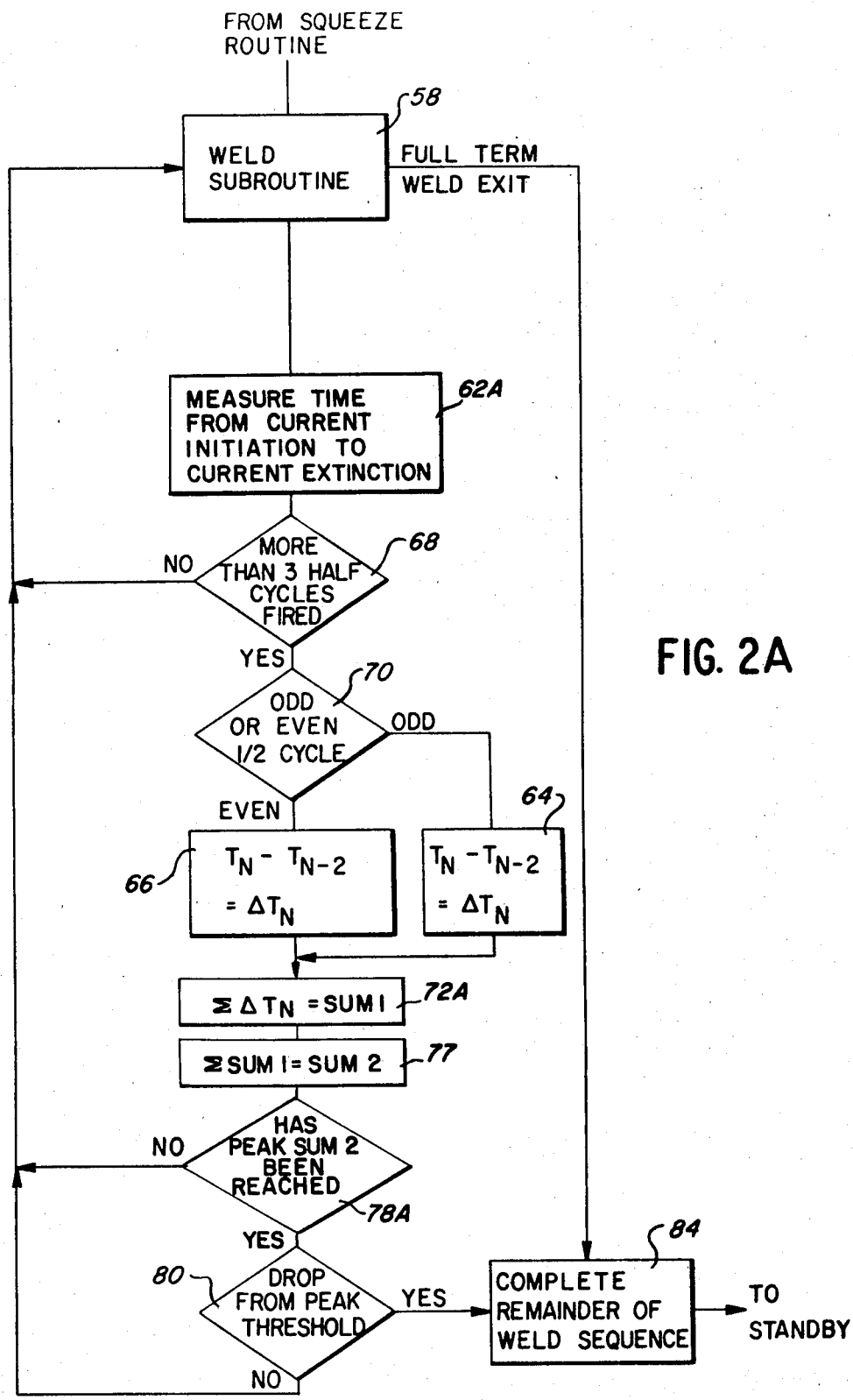
FIG. 2A is a block diagram of the flowchart utilized by the control system of FIG. 1.

Referring to a partial flowchart, as shown in FIG. 2, or 2A the operation sequence of the welding control system is similar to that described in the '724 patent with the exception of the measurement of the timing periods. The analysis of those timing period measurements and decisions derived from the analysis is detailed in the flowchart of FIG. 2 or 2A.

Upon the initiation of a weld sequence and the completion of the squeeze time, the microprocessor leaves the squeeze routine and enters a weld subroutine 58. The weld subroutine 58 includes certain checks within it and timing information necessary to fire the SCR welding contactors 22. Upon the generation of the SCR gate signal on line 40 which initiates the SCR welding contactors 22 into conduction, the microprocessor system 54 completes certain internal checks associated with controlling the current and then goes to a wait for line voltage transition state represented by a block 60 where it waits for a transition in the line voltage polarity (a zero crossing of line voltage from one polarity to another). Upon the detection of a line voltage polarity transition by polarity detector 46, the signal on line 48 causes the microprocessor system 54 to enter a five microsecond timing loop representing the known cycle time of the microprocessor to execute two instructions, one of which adds a one count to an accumulator therein every five microseconds until the APF signal generated on line 52 from the APF circuit 50 becomes zero. A measure of time to current extinction block 62 (In FIG. 2A block 62A is a measure of time from current initiation to current extinction) represents this timing loop step on the flowchart of FIG. 2. In other words, the measured time from the line voltage zero crossing to the cessation of current conduction is retained in the accumulator of the microprocessor which then further makes a decision as to whether this timing period corresponds to an odd or even half cycle of current conduction.

Figure 3:
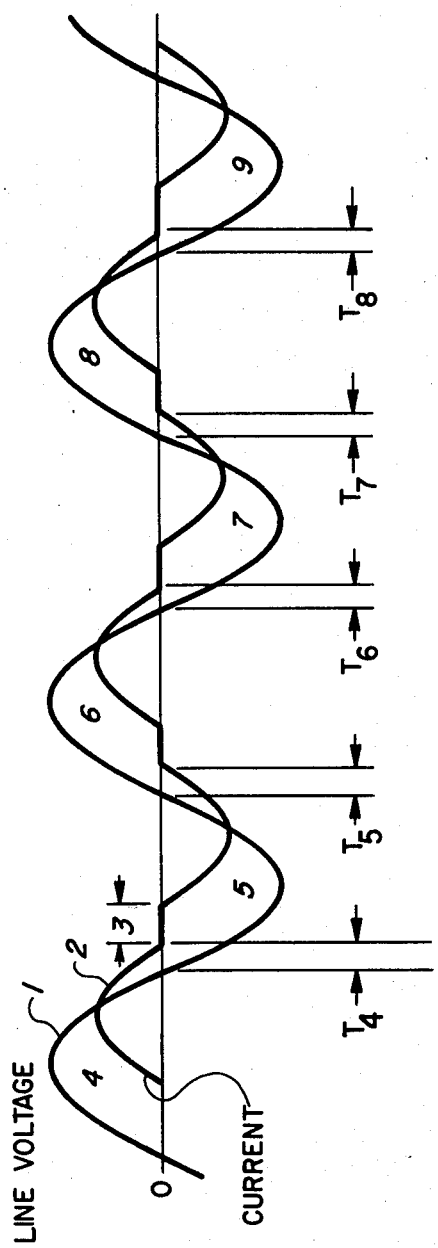
FIG. 3 shows current and voltage versus time waveforms during the early half cycles in a weld and the last half cycles in a weld which are used to explain the operation of the controller in FIG. 1.
Figure 3:
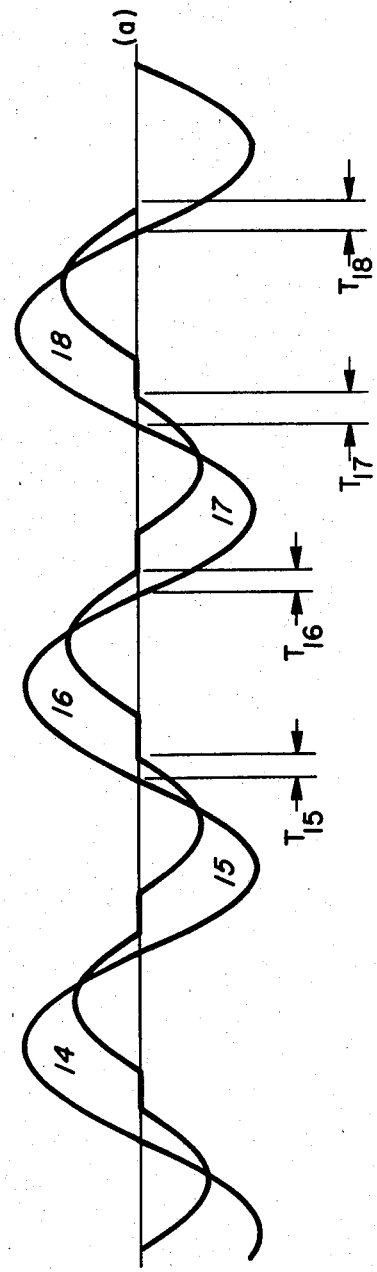

These numerical values in the accumulator representing either the time duration of the odd or even periods are stored in an odd or even memory location for later use by arithmetic blocks 64 and 66, respectively. The numerical value is the time measured from the line voltage zero crossing to the point of current extinction in five microsecond increments. In FIG. 3, time period T4 is an example of this increment of time measured from the zero line voltage crossing to the current cessation.

Figure 4A:
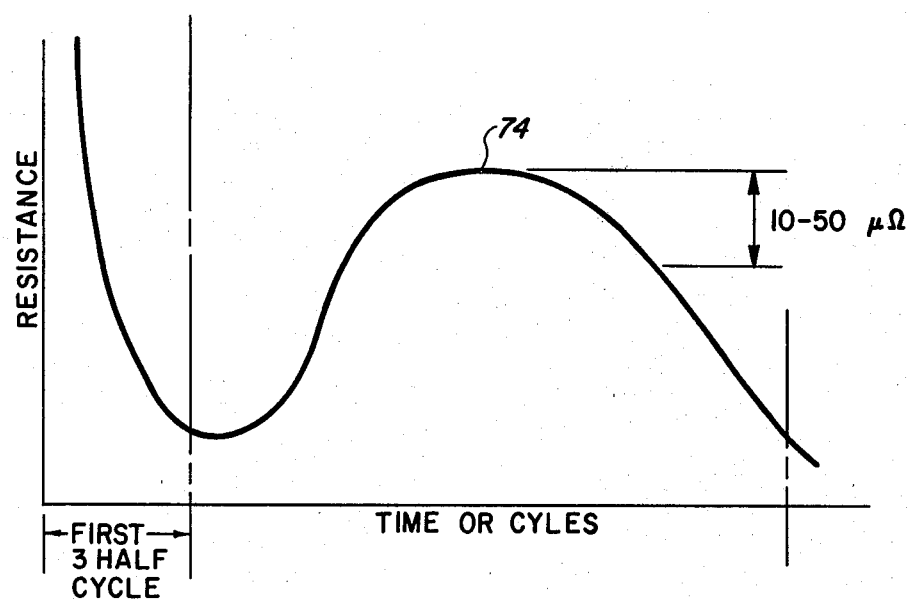
FIG. 4A shows a characteristic dynamic resistance curve during resistance welding of mild steels as occurs during the half cycles of a weld as shown in FIG. 3.
Figure 4B:
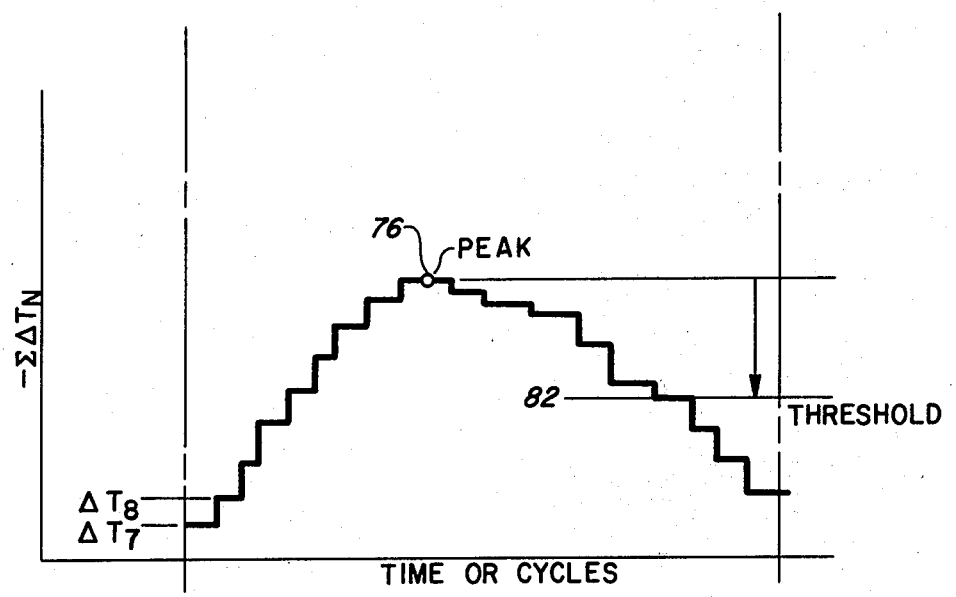
FIG. 4B illustrates graphically the reproduction of the curve in FIG. 4A by the controller of FIG. 1; and, FIG. 5 shows a current and voltage waveforms during the early half cycles in a weld and the last half cycles in a weld which illustrate the time interval changes between initiation and extinction of current in each half cycle and the measurements thereof.

Referring to FIG. 3, a sinusoidal line voltage waveform 1 is the line voltage applied to the welding transformer 26 of FIG. 1. A tip current waveform 2 represents the current conduction when SCR welding contactors 22 are gated on. A gap time 3 in tip current 2, where the SCR welding contactors 22 are non-conducting, occurs between each half cycle of current in a weld and gap time 3 is held constant throughout a weld. The weld time half cycles are numbered 4, 5, 6, 7, 8, 9 and 14, 15, 16, 17, 18. The earlier half cycles 4-9 represent that portion during the weld time when an increase in resistance occurs, as shown in FIGS. 4A and 4B. Later, half cycles 14-18 correspond to the last half cycles in the weld representing a drop in the resistance of the weld after peaks 74 and 76 in FIGS. 4A and 4B, respectively. Timing periods T4, T5, T6, T7 and T8 represent the time from the zero crossing of the line voltage 1 to the end of welding tip current 2 of each half cycle. In this instance, timing period T4=T5. Timing periods T6, T7 and T8 are smaller than T4 and T5 which indicates that an increase in resistance is taking place in the weld and that a larger power factor value is occurring. T17=T18 and both are larger than T15 which is approximately equal to T16 which indicates a decrease in resistance and a smaller power factor value.

Referring to FIG. 2, a decision block 68 is used to prevent an analysis of timing data from the first few half cycles, as experience has shown the resistance of the workpieces 38 varies indeterminantly in the early part of the weld and, thus, does not produce usuable data. However, the timing data of half cycles 5 and 6 is retained and stored in the odd or even memory storage locations, respectively. Control of the weld is returned via exit line from decision block 68 directly back to the weld subroutine 58 during the first three half cycles. After the fourth half cycle is fired, decision block 68 transfers control directly to a decision block 70 which determines whether the half cycle under consideration is numerically odd or even as previously described. In the case of the fourth half cycle which is even, the microprocessor proceeds to arithmetic block 66 where the time T4 in five microsecond increments has subtracted from it the time of the previous even half cycle, time T2 in this case. Therefore, the arithmetic equation is $T(n)-T(n-2)=\Delta T(n)$. Thus, the result of this subtraction forms Delta T4. In the case of the next half cycle, an odd half cycle, arithmetic block 64 is used to form Delta T5 which is equal to time T5 minus time T3 ($\Delta T5 = T5 - T3$). In this manner, the Delta T's for all the subsequent half cycles are formed. Moreover, it has been found necessary to form the Delta T's on an odd minus odd and even minus even basis to cancel out polarity sensitive timing errors such as rectification of the tips due to oxide and other impurities, unequal response times of SCR welding contactors, etc.

It can be shown that, for all small changes in resistance, Delta T's derived in this manner are proportional to the negative time derivative of the resistance versus time function of the dynamic resistance curve produced in the process of a weld, as shown in FIG. 4A. But, to obtain a numerical representation of the resistance versus time function suitable for analysis by the microprocessor, it is necessary to form the negative integral of the Delta T function. In numerical terms, this is accomplished by the summation shown in summation block 72 (In FIG. 2A, block 72A, summation Delta T's is equal to sum 1). If the output of the block is plotted with respect to time or weld cycles, a curve similar to FIG. 4B results, which is an approximation of the dynamic resistance curve in FIG. 4A. The height of the curve at any point is equal to the sum of Delta T's which have been accumulated to that point.

Studies of the weld strength versus resistance have shown that weld quality can be correlated with the amount of decline in resistance after peak 74 in FIG. 4A is reached, also approximated by peak 76 in FIG. 4B. (In FIG. 2A, block 77 determines if the summation of sum 1 is equal to sum 2. A decision block 78A determines if the peak sum 2 has been reached and, if so, decision block 80 then measures the drop from the peak value 76 in FIG. 4B and compares this value to a preprogrammed or threshold value 82, as seen in FIG. 4B, which is preset by the operator.) Next, a decision block 78 determines if a peak has occurred and, if so, a decision block 80 measures the drop from the peak value 76 in FIG. 4B and compares this value to a preprogrammed or threshold value 82, as seen in FIG. 4B, which is preset by the operator. If the peak is not reached, the control exits decision block 78 via a logic "no" line back to weld subroutine 58. If the peak has been reached and the drop from the peak 76 is equal to or greater than the preprogrammed or threshold value, as determined by decision block 80, the microprocessor does not return control to the weld subroutine 58 but transfers control to operation block 84 where it carries out the operations that complete the weld sequence. Exiting operation block 84, the microprocessor returns to the standby state where it awaits another trigger initiation from the operator. Thus, the current to a weld is always terminated when a predetermined resistive drop occurs as associated with a quality weld.

Moreover, it has been determined in the present invention that the resistance welder load in the secondary circuit 3, as seen from the primary side of the welding transformer 26, can be approximately represented by a series circuit consisting of an inductive component resulting from the transformer leakage reactance, a secondary loop reactance, and resistive components consisting of all the resistances including the resistance of workpieces 38. In terms of the primary circuit 24, secondary impedances are reflected as the square of the turns ratio.

Under conditions of a sinusoidal driving voltage and uninterrupted current conduction, the current will lag the voltage by an angle commonly referred to as the power factor angle. If the resistance component is made larger, the power factor angle becomes smaller and, conversely, if the resistance is made smaller, the power factor angle becomes larger. Thus, by observing changes in the power factor angle, changes in the resistance can be measured.

In a case where the current is interrupted by the action of the SCR welding contactors 22, as seen in FIG. 3 waveform, an analogous effect is observed. That is, the current extinction angle with respect to the voltage zero crossing behaves in a manner similar to the power factor angle in the uninterrupted current case. If the resistance is increased, the current extinguishes (goes to zero) at a smaller angle. If the resistance decreases, the current extinguishes at a larger angle.

Referring now to FIG. 3, if the resistance increase were to occur between the half cycles of current associated with voltage half cycle 5 and 6, time period T6 would be smaller than time periods T4 and T5. Thus, the difference in time Delta T6 between T6 and T5 or T4 would be negative and, for small changes in resistance, proportional to the change in resistance through the workpieces 38. Later, in the weld period, a fall in resistance across the weld will occur, e.g., between half cycles 15 and 16. A decrease in resistance will be observed as a positive Delta T17.

Figure 5:
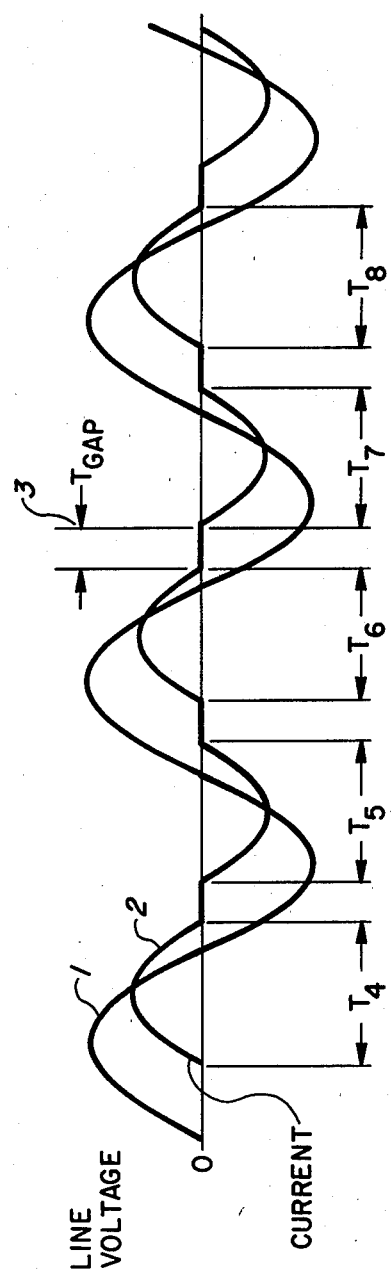
Figure 5:
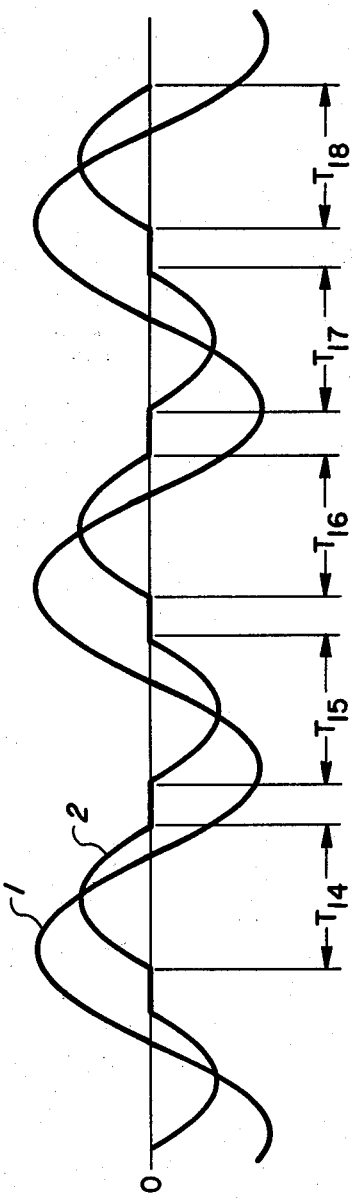

Referring to FIG. 5, another embodiment of the present invention does not require the use of the line voltage zero crossing as a timing reference point or instant and uses the total conduction time of the current as a measurement of the interval. The interval for each half cycle now begins with the initiation of weld current and terminates at the extinction of weld current. Intervals T4, T5, T6, T7, and T8–T14, T15, T16, T17 and T18, representing each half cycle of current conduction as shown in FIG. 5, begins the instant when current is initiated and ends when current is extinguished. To accomplish the foregoing, decision block 60 of FIG. 2 is modified to detect the initiation of weld current each half cycle. In FIG. 5, which illustrates the sinewave line voltage 1 and the intermittent current waveform 2 through SCR welding contactors 22, the gap time 3, labeled T gap in FIG. 3, is held constant between each weld pulse.

Under steady state conditions, if there are no changes in the workpiece resistance, conduction time periods T4, T5, etc., are equal to the time periods of one voltage half cycle less the gap time, T gap. If a positive change in resistance occurs during T gap between intervals T5 and T6, the current of half cycle 6 will extinguish earlier than normal and half cycle conduction time T6 will become smaller than the preceding half cycle conduction time T5. Because the gap time T gap is held constant, the initiation point of half cycle 7 will occur earlier than normal which tends to make the conduction time T7 longer; however, counteracting this is the fact that the circuit resistance is still larger than its initial value by the positive resistance change which occurred earlier. The result of these two counteracting tendencies is to cause half cycle conduction time T7 to be approximately equal to the undisturbed conduction times T4 and T5. Current half cycle 8 will be initiated at approximately the proper time and will approach the steady state current conduction time. In the absence of further resistance changes, the half cycle conduction times settle down to a normal time period of one half cycle of line voltage less the gap time, T gap. Thus, the current conduction times of each half cycle respond in a manner that is approximately proportional to the negative time derivative of the circuit resistance. To obtain a measure of the resistance value of the workpiece from the negative time derivative of the resistance, the block 72 in FIG. 2 is modified by the inclusion of a second summation capability. In numeric terms, summation is approximately equivalent to integration.

By observing the progression of the resistance samples as the weld is being made, the feedback welder control system judges on a half-cycle-by-half-cycle basis whether or not the weld should be continued. The resistive curve formed by plotting the resistive samples versus time on a number of half cycles takes on the shape and height of the dynamic resistive curve applicable to the materials being joined together by the weld, as shown in FIG. 4B.

It can be seen from the waveforms in FIG. 5 that the control system of the present invention uses a signal that is proportional to resistive changes in the workpiece by measuring an interval between an instant when half cycle welding current is initiated or the occurrence of a reference instant which may be derived from the current waveform and the instant current is extinguished. The intervals occurring during a preprogrammed half cycle and subsequent half cycles are compared and, when the measured differences therebetween are equal to or greater than a preprogrammed or threshold value, the weld is terminated.

While certain preferred embodiments of the invention have been specifically disclosed, it is understood that the invention is not limited thereto, as many variations will be readily apparent to those skilled in the art, and the invention is to be given its broadest possible interpretation within the terms of the following claims.

I claim:

1. A control system for controlling the quality of a weld in a resistance welding apparatus with the apparatus including a pair of welding electrodes and a welding transformer having a secondary winding connected to the electrodes and a primary winding connectible to an AC source for energizing the primary winding and the secondary winding with alternating polarity half cycles of welding current comprising:
   means for measuring a change in an interval between the instant when current is initiated and extinguished during a preprogrammed half cycle and at least one subsequent half cycle; and,
   means for terminating the weld current when the measured change is at least equal to a programmed threshold value indicative of a quality weld.

2. A method for controlling the quality of a weld that is formed by a resistance welding apparatus with the apparatus including a pair of welding electrodes engageable with a pair of workpieces that are to be welded together and a welding transformer connected to the electrodes and a primary winding connectible to an AC source for energizing the primary and the secondary winding with alternating polarity half cycles of welding current comprising:
   providing a signal indicative of a time period from a reference instant to current extinction in a preprogrammed half cycle of weld current and at least one subsequent half cycle of current in a weld;
   measuring the duration of intervals betweeen the reference instant and current extinction during the preprogrammed half cycle and subsequent half cycles; and,
   terminating the welding current when measured intervals are at least equal to a preprogrammed threshold value indicative of a quality weld.

3. A control system for controlling the quality of a weld as formed in a resistance welding apparatus with the apparatus including a pair of welding electrodes and a welding transformer having a secondary winding connected to the electrodes and a primary winding connectable to an AC source for energizing the primary and the secondary windings with alternating polarity half cycles of welding current comprising:
   means providing a signal indicative of an instant when each half cycle of welding current in a winding of the transformer is extinguished;
   means for measuring an interval betweeen a reference instant and the signal indicative of current extinction during each half cycle; and,
   means responsive to differences between said measured intervals for terminating the welding current when the differences are at least equal to a preprogrammed threshold value.

4. A control system for controlling the quality of a weld in a resistance welding apparatus with the apparatus including a pair of welding electrodes and a welding transformer having a secondary winding connected to the electrodes and a primary winding connectible to an AC source for energizing the primary winding and the secondary winding with alternating polarity half cycles of welding current comprising:
   means providing a signal indicative of the duration of welding current in one of the transformer windings during a preprogrammed half cycle and signals indicative of the duration of welding current in the transformer winding during half cycles subsequent to the preprogrammed half cycle; and,
   means for terminating the welding current when the difference between the duration of welding current in the winding during subsequent half cycles and the preprogrammed half cycle is at least equal to a preprogrammed threshold value.

5. The control system as recited in claim 3 wherein half cycle current in the primary winding is used to provide the signal indicative of the instant when the half cycle current is extinguished.

6. The control system as recited in claim 3 wherein the reference instant is provided by a polarity change in the source voltage applied to the primary winding and the instants of current extinction are provided by half cycle current in the primary winding.

7. The control system as recited in claim 4 wherein the signals are indicative of the half cycle of current in the primary winding of the transformer.

* * * * *